United States Patent
Scofield et al.

(10) Patent No.: US 9,130,347 B2
(45) Date of Patent: Sep. 8, 2015

(54) NANOPILLAR PHOTONIC CRYSTAL LASERS

(71) Applicant: The Regents of the University of California, Oakland, CA (US)

(72) Inventors: Adam C. Scofield, Los Angeles, CA (US); Diana Huffaker, Los Angeles, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 14/071,283

(22) Filed: Nov. 4, 2013

(65) Prior Publication Data

US 2014/0286367 A1  Sep. 25, 2014

Related U.S. Application Data

(60) Provisional application No. 61/721,888, filed on Nov. 2, 2012.

(51) Int. Cl.
*H01S 5/00* (2006.01)
*H01S 5/10* (2006.01)
*H01S 5/34* (2006.01)
*H01S 5/04* (2006.01)

(52) U.S. Cl.
CPC .............. *H01S 5/1042* (2013.01); *H01S 5/105* (2013.01); *H01S 5/341* (2013.01); *H01S 5/041* (2013.01); *H01S 2301/176* (2013.01)

(58) Field of Classification Search
CPC ... H01S 5/18319; H01S 3/0632; H01S 3/169; H01S 5/10; H01S 5/105; H01S 5/1042; H01S 2301/176; H01S 3/08; H01S 5/041; H01S 5/183; H01S 5/3013; H01S 5/341
USPC ....................................................... 372/43.01
See application file for complete search history.

(56) References Cited

U.S. PATENT DOCUMENTS

| | | | |
|---|---|---|---|
| 2010/0035412 A1* | 2/2010 | Samuelson et al. ............ 438/478 |
| 2011/0036396 A1* | 2/2011 | Jayaraman et al. ............ 136/255 |
| 2012/0273662 A1* | 11/2012 | Caldwell et al. ............ 250/214.1 |

OTHER PUBLICATIONS

Algra et al. Nature 2008, 456, 369.
Chang, T-R Lin, S.L. Chuang. Opt. Express 2010, 18, 15039.
Chen et al., Nature Photon. 2011, 5, 170.
(Continued)

*Primary Examiner* — Tod T Van Roy
*Assistant Examiner* — Vu A Vu
(74) *Attorney, Agent, or Firm* — John P. O'Banion; Henry J. Daley

(57) ABSTRACT

A nanopillar photonic crystal laser includes a plurality of nanopillars and a support structure in contact with at least a portion of each of the nanopillars. Each nanopillar has an axial dimension and two mutually orthogonal cross dimensions. The axial dimension of each of the nanopillars is greater than the two mutually orthogonal cross dimensions, where there mutually orthogonal cross dimensions are less than about 1 μm and greater than about 1 nm. The support structure holds the plurality of nanopillars in preselected relative orientations and displacements relative to each other to form an array pattern that confines light of a preselected wavelength to a resonance region that intercepts at least one nanopillar of the plurality of nanopillars. The at least one nanopillar includes a lasing material to provide an output laser beam of light at the preselected wavelength.

18 Claims, 13 Drawing Sheets

(56) References Cited

OTHER PUBLICATIONS

Gargas et al., ACS Nano 2010, 4, 3270.
Heo, W. Guo, P. Bhattacharya. Appl. Phys. Lett. 2011, 98, 21110.
Ikejiri et al., Nanotechnology 2008, 19, 265604.
Johnson et al., Phys. Rev. B 1999, 60, 5751.
Kim et al., Opt. Express. 2008, 16, 6515.
Kim, S-K Kim, Y-H Lee. Phys. Rev. B 2006, 73, 235117.
Kuykendall, P. Ulrich, S. Aloni, P. Yang. Nature Mater. 2007, 6, 951.
Lauhon, M.S. Gudiksen, D. Wang, C.M. Lieber. Nature 2002, 420, 57.
Li, C.Z. Ning. Phys. Rev. B 2009, 80, 153304.
Loncar, A. Scherer, Y. Qiu. Appl. Phys. Lett. 2003, 82, 4648.
Martensson et al. Nano Lett. 2004, 4, 1987.
Ning. Phys. Status Solidi B 2010, 247, 774.
Noborisaka, J. Motohisa, T. Fukui. Appl. Phys. Lett. 2005, 86, 213102.
Nomura, N. Kumagai, S. Iwamoto, Y. Ota, Y. Arakawa. Opt. Express 2009, 17, 15975.
Nozaki, S. Kita, T. Baba. Opt. Express 2007, 15, 7506.
Oulton et al., Nature 2009, 461, 629.
Painter et al., Science 1999, 284, 1819.
Park F. Qian, C.J. Barrelet, Y. Li. Appl. Phys. Lett. 2007, 91, 251115.
Ryu, M. Notomi, Y-H Lee. Appl. Phys. Lett. 2003, 83, 4294.
Scofield et al., Nano Lett. 2011, 11, 2242.
Shapiro et al., Appl. Phys. Lett. 2010, 97, 243102.
Tanaka, T. Asano, Y. Akahane, B-S Song, S. Noda. Appl. Phys. Lett. 2003, 82, 1661.
Tomioka, J. Motohisa, S. Hara, T. Fukui. Jap. Journal of Appl. Phys. 2007, 46, 1102.
Tomioka, J. Motohisa, S. Hara, T. Fukui. Nano Lett. 2008, 8, 3475.
Tran, S. Combrie, A.D. Rossi. Phys. Rev. B 2009, 79, 041101.
Yan, D. Gargas, P. Yang. Nature Photon. 2009, 3, 569.

\* cited by examiner

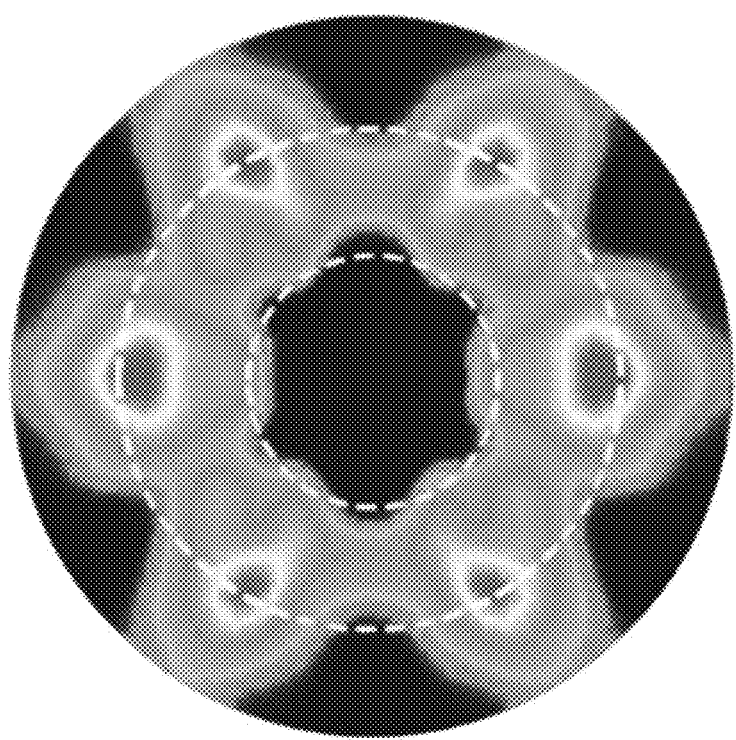
Fig. 8

NANOPILLAR PHOTONIC CRYSTAL LASERS

CROSS-REFERENCE OF RELATED APPLICATION

This application claims priority to U.S. Provisional Application No. 61/721,888 filed Nov. 2, 2012, the entire contents of which are hereby incorporated by reference.

STATEMENT OF GOVERNMENT SUPPORT

This invention was made with Government support under N00244-09-1-0091, awarded by the United States Navy, Office of Naval Research, and FA9550-08-1-0198 and FA9550-09-1-0270, awarded by the United States Air Force, Air Force Office of Scientific Research. The Government has certain rights in the invention.

TECHNICAL FIELD

The field of the currently claimed embodiments of this invention relates to a nanopillar photonic crystal laser and a method of fabricating the same. In particular, this invention relates to an array of nanopillars forming a nanopillar photonic crystal laser.

BACKGROUND

In the past decade, intense research has been performed in the area of nanowires and nanopillars. These semiconductor nanostructures can be synthesized with specific material compositions, axial and radial heterostructures, and on large lattice-mismatched substrates, including silicon. Such attributes, combined with their small cross sections, promise new device architectures and pathways to on-chip photonic integration.

An essential component for a viable photonic circuit, for example, is a high-performance nanowire-based laser. Thus, the current state of the art optical microcavity design and fabrication method for nanowires or nanopillars is for laser applications. Researchers have sought to make efficient nanowire-based lasers by a number of methods, including top-down photonic crystal cavities, micro-stadium resonators, plasmonic waveguides, and nanowires that support whispering gallery modes. These designs and methods often involve multiple material deposition and fabrication steps, including precision alignment since nanowires grown by this method also have random placement.

So far, these demonstrations have largely been limited to single nanowires due to lack of control over position and diameter, thus inhibiting low-loss optical cavity design with sufficient material gain, while avoiding highly detrimental surface recombination. In some cases, the resonant cavity and the nanowire active region require separate lithography and processing steps. In other cases, the cavity is simply limited by optical losses at the facets.

The nanowire-laser demonstrations to date are less efficient at trapping light than some embodiments of the current invention, and consequently the threshold power of these may be larger by a factor of 1000 or more. The large threshold power densities and awkward external coupling schemes make them impractical for large-scale integration. Typical reported values of threshold power density range from approximately 100 kW/cm$^2$ to greater than 1 MW/cm$^2$ and require femtosecond pulses. Furthermore, most reported nanowire-based lasers are multimode, which can limit their utility for communications and multiplexing applications. Lasers such as vertical cavity surface emitting lasers and "top-down" photonic-crystal lasers have similar performance to some embodiments of the current invention, but require growth of thick semiconductor films and cannot be integrated on silicon without extensive and low yield process steps such as wafer bonding.

In order to overcome problems in existing devices and methods, including some of the above problems, and to realize a practical nanowire-based laser solution, a high-Q cavity with effective surface passivation is necessary. Of the different possible candidates for high-Q optical cavities, photonic crystal nano-cavity resonators are an attractive choice due to small mode volume, high spontaneous emission coupling factor, and low threshold power.

SUMMARY

A nanopillar photonic crystal laser according to an embodiment includes a plurality of nanopillars and a support structure in contact with at least a portion of each of the plurality of nanopillars. Each of the plurality of nanopillars has an axial dimension and two mutually orthogonal cross dimensions. The axial dimension of each of the plurality of nanopillars is greater than the two mutually orthogonal cross dimensions and the mutually orthogonal cross dimensions are, for example, less than about 1 µm and greater than about 1 nm. The support structure holds the plurality of nanopillars in preselected relative orientations and displacements relative to each other to form an array pattern that confines light of a preselected wavelength to a resonance region that intercepts at least one nanopillar of the plurality of nanopillars. Additionally, the at least one nanopillar includes a lasing material to provide an output laser beam of light at the preselected wavelength.

A method of making a nanopillar photonic crystal laser according to an embodiment includes providing a mask layer on a substrate and patterning the mask layer to form a plurality of holes in the mask layer. The method also includes growing a plurality of nanopillars on the substrate through the plurality of holes such that the plurality of nanopillars are arranged in an array pattern with preselected relative orientations and displacements relative to each other. The plurality of nanopillars in the array pattern confines light of a preselected wavelength to a resonance region that intercepts at least one nanopillar of the plurality of nanopillars, and the least one nanopillar includes a lasing material to provide an output laser beam of light at the preselected wavelength.

BRIEF DESCRIPTION OF THE DRAWINGS

Further objectives and advantages will become apparent from a consideration of the description, drawings, and examples.

FIG. 8 shows a Far-field radiation pattern of the cavity hexapole mode according to an embodiment of the current invention. The far-field data over the upper hemispherical points (θ,φ) is represented in (x,y) by the mapping defined by x=θ cos φ and y=θ sin φ.

DETAILED DESCRIPTION

Figure 1:
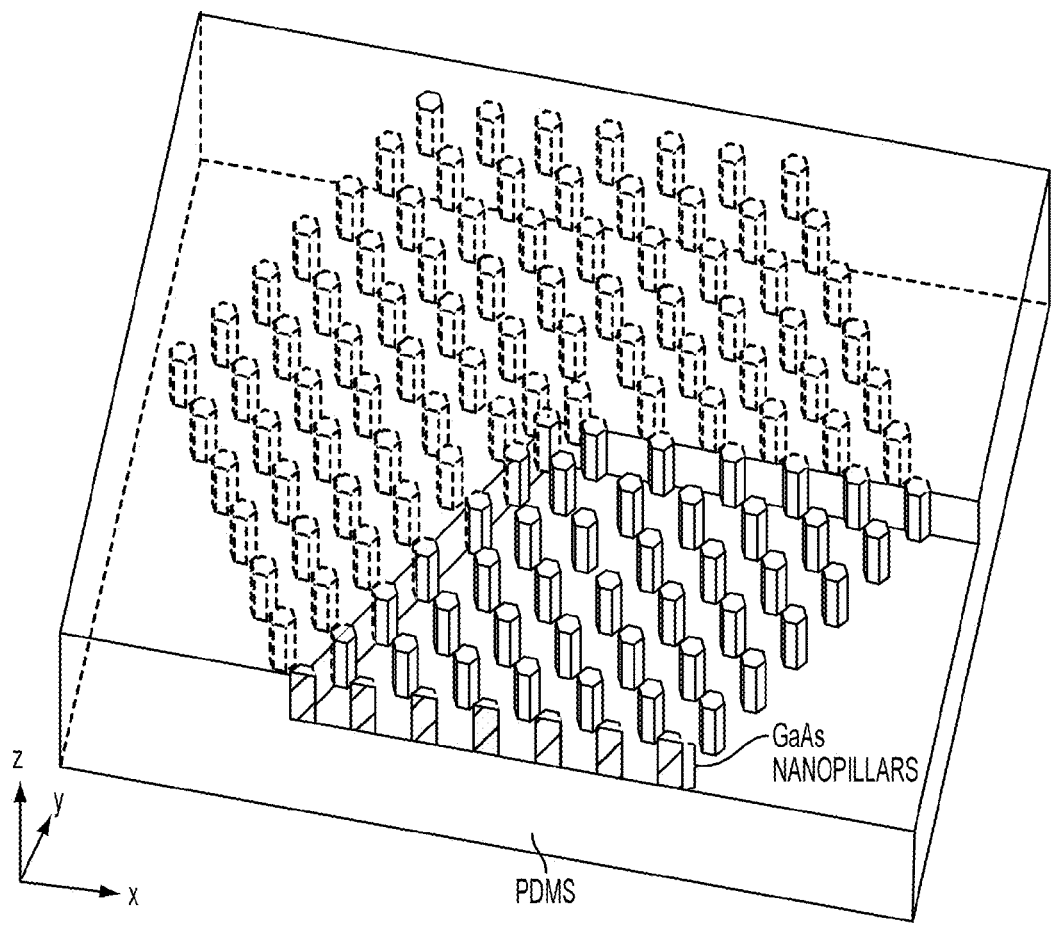
FIG. 1 shows a schematic diagram of a nanopillar photonic crystal laser in PDMS according to an embodiment of the current invention.

Some embodiments of the current invention are discussed in detail below. In describing embodiments, specific terminology is employed for the sake of clarity. However, the invention is not intended to be limited to the specific terminology and examples selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated. All references cited in this specification are incorporated herein by reference.

The terms "nanopillar" and "nanowire" are used interchangeably herein. Use of only one of these terms in a given context is not meant to exclude applicability of the other, but instead encompasses the applicability of either structure.

"Light" as used herein may refer to visible wavelengths of light as well as non-visible wavelengths of light. More broadly, "light" may refer to wavelengths on any portion of the electromagnetic spectrum, including, for example, visible, infrared, near-infrared, ultraviolet, etc.

According to some embodiments of the current invention, a photonic crystal laser device and method of making the same are introduced. This device and method uses a "bottom-up" approach to form a photonic crystal cavity in an array of nanopillars. The photonic crystal cavity may be formed, for example, entirely by III-V nanopillars using catalyst-free, selective-area, metal-organic chemical vapor deposition. The resulting device is fundamentally different from previous devices and methods in that it uses a nanopillar ensemble rather than a single nanowire to form both active region and cavity. This approach is enabled by accurate control of the position and diameter of the nanopillars, whereby the photonic band-gap and active gain region can be grown simultaneously from a masked substrate. By carefully engineering the geometry, spacing, and composition of the nanopillars forming the cavity, a low-threshold single mode lasing at room-temperature is achieved. Moreover, embodiments of the current invention can provide small, low power, and inexpensive lasers.

Some embodiments provide a high quality optical microcavity using only nanowires or nanopillars to confine light. This can provide a method that is effectively a "bottom-up" approach to forming high quality optical cavities. This design can allow nanowire lasers to operate with low threshold power, making them practical for use in integrated systems. Because of this and the fact that nanowires can be grown on inexpensive substrates including silicon, some embodiments of the current invention can have great potential in future optical communication in computer chips and low cost photonic integrated circuits. For example, some embodiments may be applied in multiplexing applications. Other applications of the lasers may include inexpensive and disposable light sources for spectroscopy in microfluidics, including integrating the nanopillar array into polydimethylsiloxane (PDMS) structures often used in microfluidics.

Some embodiments allow for high device performance from nanowire and nanopillar lasers. An approach of forming photonic crystal cavities entirely with nanowires or nanopillars may be used to better guarantee the performance of devices such as lasers due to lack of error in misalignment and fewer fabrication defects since it is a simpler process. This method can also place the devices at predetermined locations, allowing for wafer scale integration that is currently not possible by other methods.

The nanowire or nanopillar based microcavities are formed by deposition of the nanopillar materials onto a substrate. In some embodiments, this may be achieved via selective-area metal-organic chemical vapor deposition on either GaAs (111)B, InP (111)A, or Si (111) substrates. For the selective growth, a film such as an inert dielectric thin film, for example, is patterned to form an array of growth areas. Patterning may be done by electron-beam lithography, optical lithography, nanoimprint lithography, or any other form of lithography or patterning known in the art. Etching is then performed using, for example, reactive ion etching or wet chemical etching. The resulting nanohole array patterns define the positions and diameters of the nanowires or nanopillars.

In addition, the positions and diameters of the holes in the film can be designed to form a photonic band gap in the resulting nanopillars. A break in the band gap forms the microcavity to confine the light. During growth of the nanopillars, the composition and structure can be controlled to accurately place emitter materials in the optimal position of the microcavity. In preferred embodiments, the emitter materials may be confined to a limit region of the nanopillar to provide a more efficient laser. However, the emitter materials may also be used over substantially the whole length of the nanopillar. Additionally, a passivation layer may be formed on the surface of each nanopillar to prevent non-radiative recombination at the surfaces. In some embodiments, this may be done by lateral overgrowth of a high band-gap semiconductor such as InGaP. For example, the nanopillars may have a GaAs/InGaAs/GaAs axial double heterostructure and lateral InGaP shells or passivation layers.

Further details of some embodiments of the current invention are described in the examples below.

Figure 2:
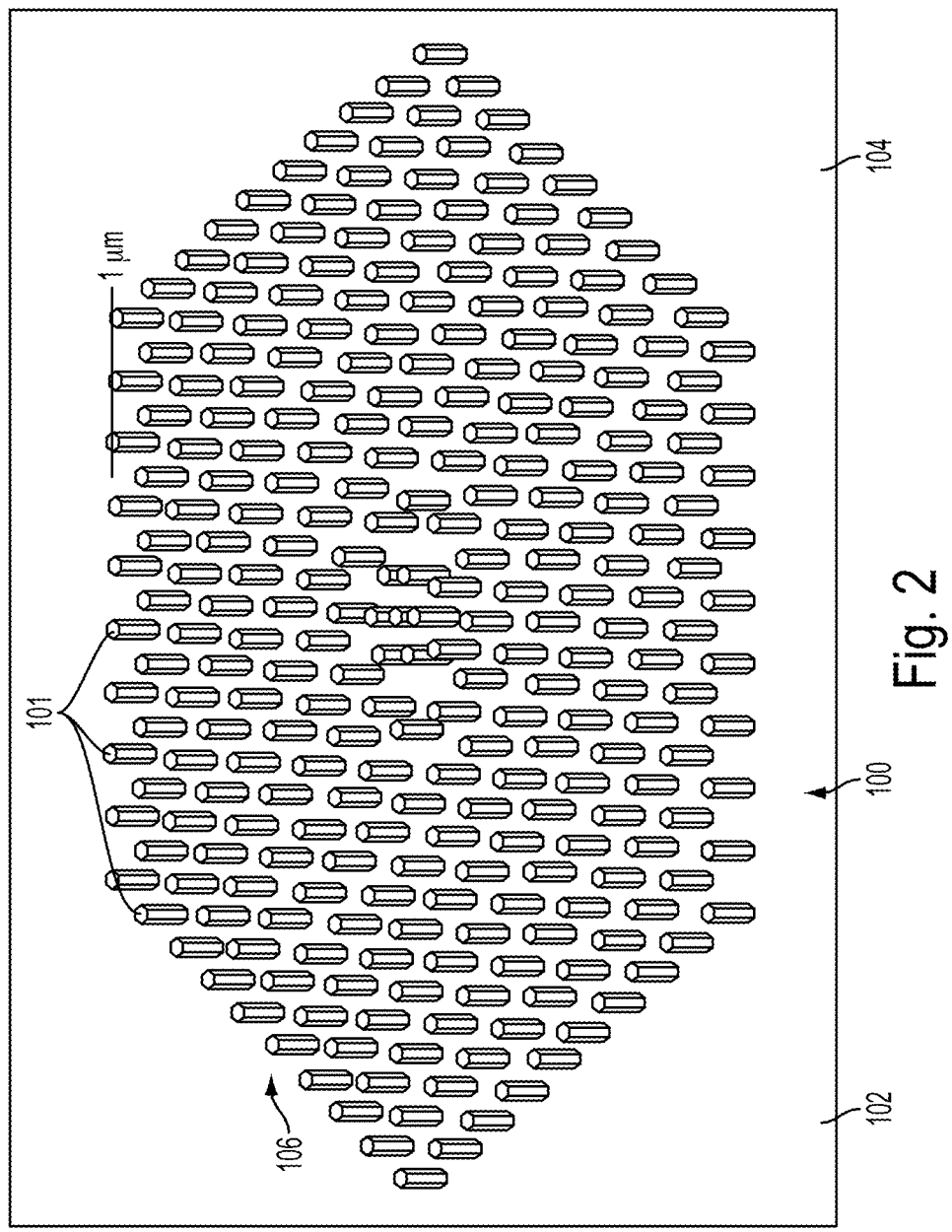
FIG. 2 shows a 45°-tilted SEM micrograph of a nanopillar photonic crystal as grown on the substrate according to an embodiment of the current invention.
Figure 14:
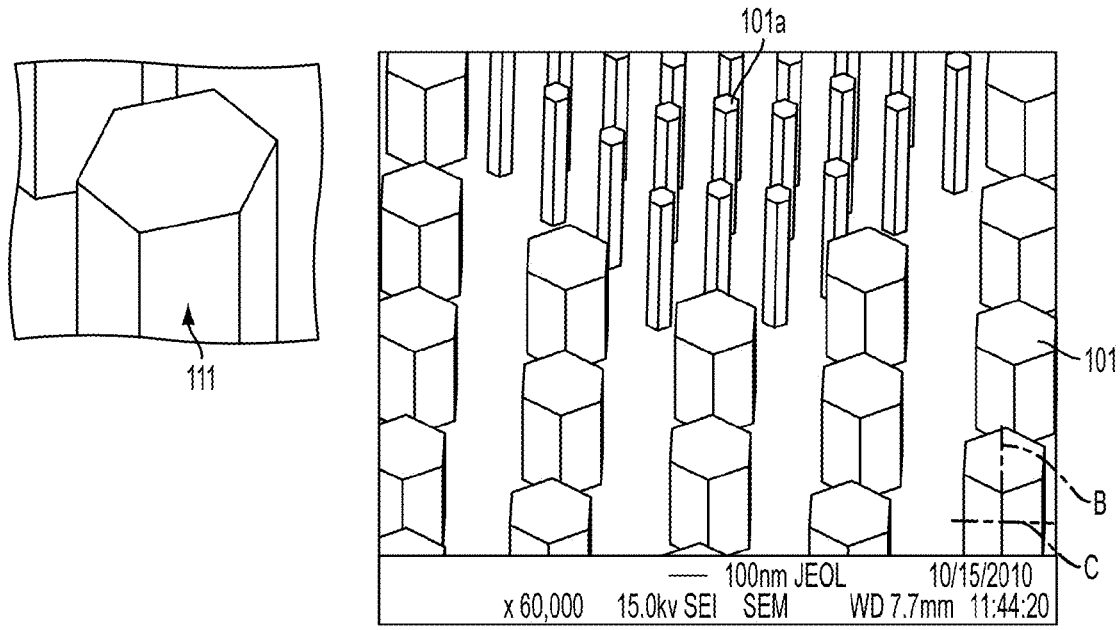
FIG. 14 shows an example of a close-up of the array of nanopillars (right) and a closer view of an individual nanopillar showing the crystal faces according to an embodiment of the current invention.

In an embodiment, the nanopillar photonic crystal laser 100 shown in FIG. 2, for example, includes a plurality of nanopillars 101 each having an axial dimension A (see FIG. 3) and two mutually orthogonal cross dimensions B, C (see FIG. 14). The axial dimension A of each of the plurality of nanopillars 101 is greater than the two mutually orthogonal cross dimensions B, C. In addition, the mutually orthogonal cross dimensions B, C may be less than 1 μm and greater than 1 nm. More particularly, the mutually orthogonal cross dimensions B, C of each of said plurality of nanopillars are less than about 1 μm and greater than about 10 nm. The nanopillar photonic crystal laser 100 also includes a support structure 102, shown in FIG. 2, for example, in contact with at least a portion of each of the nanopillars 101. The support structure 102 holds the plurality of nanopillars 101 in preselected relative orientations and displacements relative to each other to form an array pattern that confines light of a preselected wavelength to a resonance region that intercepts at least one nanopillar 101a of the plurality. This at least one nanopillar 101a includes a lasing material 103 to provide an output laser beam of light at that preselected wavelength.

In some embodiments, the support structure 102 is a PDMS layer 104, shown in FIG. 2. In other embodiments, after growth of the nanopillars 101, PDMS 104 can be provided on the growth substrate 105 to surround at least a portion of each nanopillar 101 as illustrated in FIG. 11. After the PDMS layer 104 is cured, it can then be mechanically removed or lifted-off the substrate 105. In this lift-off process, the nanopillars 101 may be detached from the substrate 105 at their base. The result is a nanopillar array 106 within PDMS 104 and having the same array pattern as when formed on the substrate 105. This device can serve as a flexible and transparent laser. The nanopillars 101 may be partially exposed from the PDMS 104 on one end of the nanopillars 101 that was formerly the base end connected to the substrate 105. In other embodiments, the support structure 102 may be a substrate 105 that is attached to or integral with each of the nanopillars.

At least one and as many as all of the plurality of nanopillars 101 has a passivation layer 107 on a circumferential surface thereof. The passivation layer 107 is essentially a shell circumferentially surrounding a core material 108 of each nanopillar 101. In addition, the passivation layer 107 may be formed of a material having a band gap that is larger than a band gap of the core material 108 of the nanopillar 101.

Figure 4:
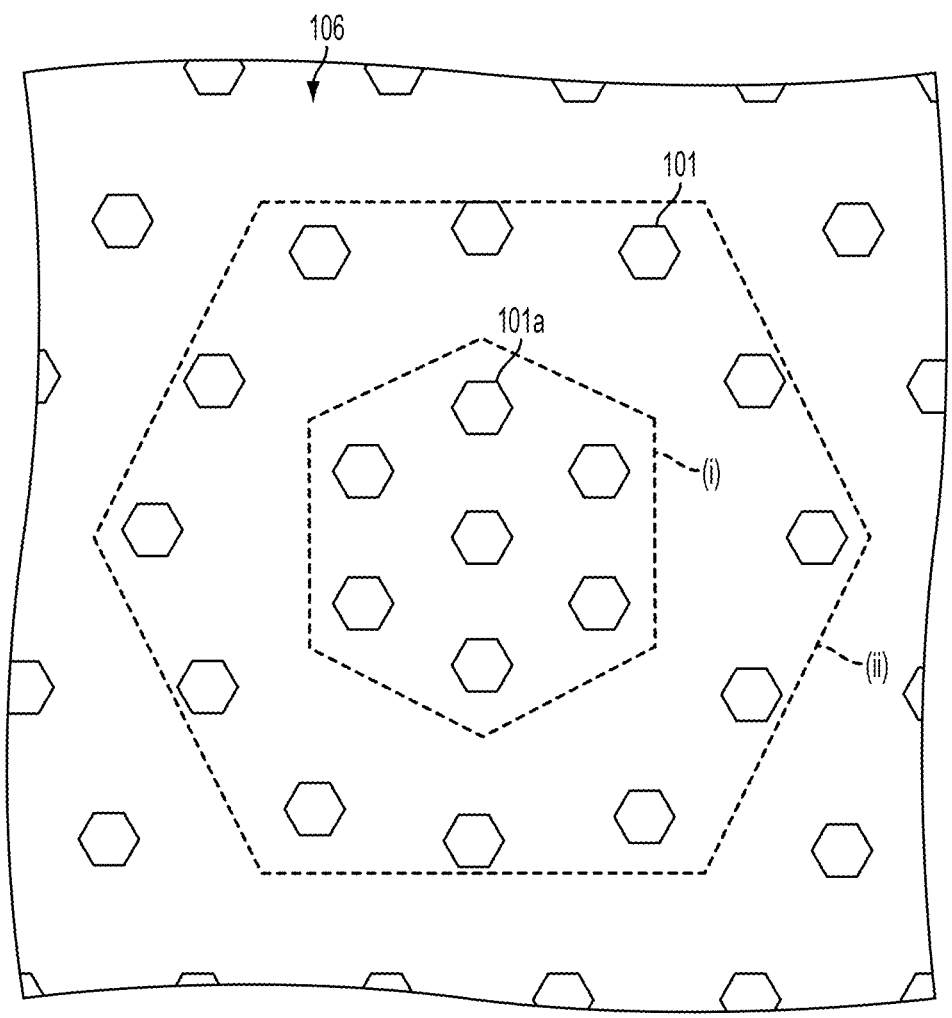
FIG. 4 shows a top-down SEM micrograph of nanopillars forming the high-Q cavity according to an embodiment of the current invention. The two hexagonal contours labeled (i) and (ii) show the regions where the nanopillar positions were optimized.

The array pattern 106 includes a sub-array of nanopillars that surround the at least one nanopillar 101a with the lasing material 103 and that have preselected relative orientations and displacements relative to each other that differ from preselected relative orientations and displacements to the at least one nanopillar 101a. FIG. 4 shows an example where some nanopillars 101 of the sub-array are outlined in region (ii) and the at least one nanopillar 101a is shown as seven nanopillars in region (i). The inter-pillar spacings and orientations of the nanopillars in region (i) differ from those in region (ii).

The plurality of nanopillars 101 are fixed or held by the support material 102 or other mechanism in orientations that are substantially parallel to each other. The plurality of nanopillars 101 can have, for example, at least 50 nanopillars and the preselected relative displacements of the nanopillars may be accurate to within 10%, for example.

Figure 12:
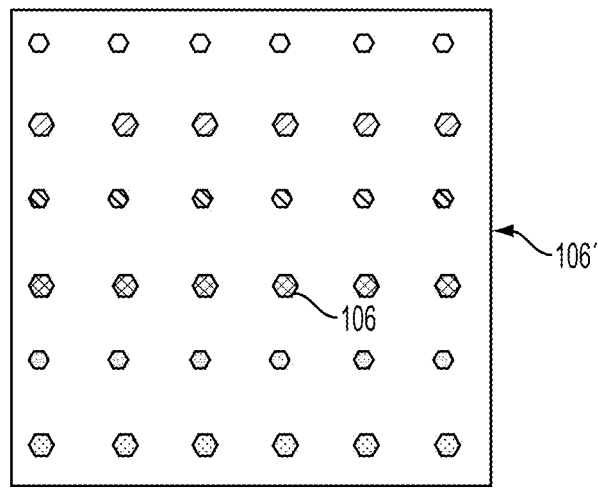
FIG. 12 shows an example of multiple arrays of nanopillars where each array is tuned to a different wavelength of light by varying the spacing and diameter of the nanopillars according to some embodiments of the current invention.
Figure 13:
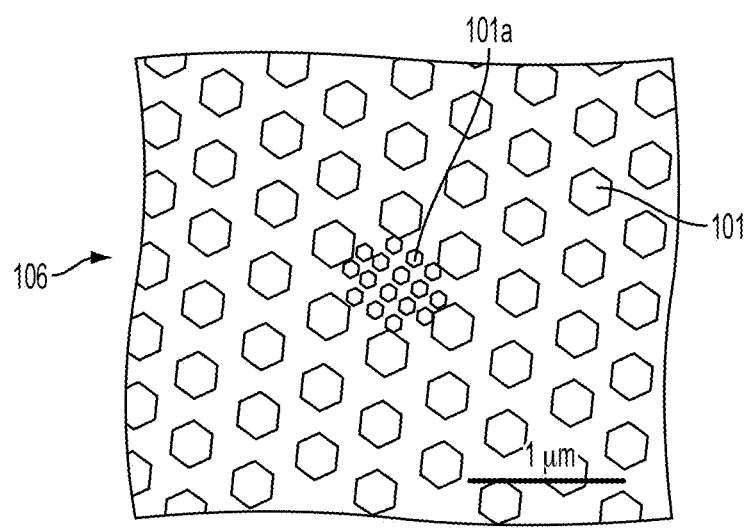
FIG. 13 shows an example of one possible configuration of nanopillars according to an embodiment of the current invention.

In some embodiments, a nanopillar array 106 has a hexagonal shape. Examples of such arrays can be seen, for example, in FIGS. 1, 2, and 4. However, an array is not limited to a hexagonal shape. The arrays, including inter-pillar spacing and nanopillar diameter can be varied in order to tune the nanopillar photonic crystal laser 100 to different wavelengths of light. FIG. 12 shows an example of a series of arrays 106' with different characteristics and that emit light of different wavelengths. The light of the nanopillar photonic crystal laser 100 is not limited to visible light, but may include any wavelength in the electromagnetic spectrum.

In an embodiment, a method of making a nanopillar photonic crystal laser 100 is provided. The method includes providing a mask layer 109 on a substrate 105 and patterning the mask layer 109 to form a plurality of holes 110 in the mask layer 109. This plurality of holes 100 is arranged in an array which will dictate the shape of the nanopillar arry 106 and each nanopillar diameter. The method also includes growing the plurality of nanopillars 101 on the substrate 105 through the plurality of holes 110. Accordingly, the plurality of nanopillars 101 are arranged in an array pattern corresponding to the holes 110 of the mask layer 109, and have preselected relative orientations and displacements relative to each other. The plurality of nanopillars 101 in the array pattern 106 confines light of a preselected wavelength to a resonance region that intercepts at least one nanopillar 101a of the plurality.

Additionally, the at least one nanopillar includes a lasing material to provide an output laser beam of light at the preselected wavelength that was confined to the resonance region.

The method may also include, prior to growing the plurality of nanopillars, a step of etching the substrate where it is exposed by the holes in the mask layer. When growing the plurality of nanopillars 101, a passivation layer 107, as discussed above, can be formed on a circumferential surface of each of the nanopillars 101.

Figure 11A:
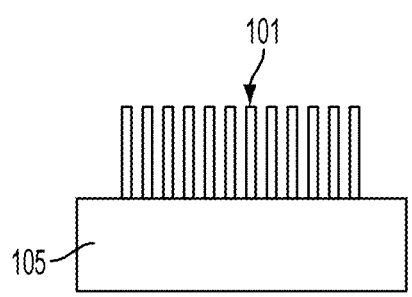
FIG. 11 shows (a)-(c) a process of forming a PDMS layer around the nanopillar array according to an embodiment of the current invention, (d) lifting-off the PDMS layer with the nanopillar array, and (e) the resulting device (e).
Figure 11B:
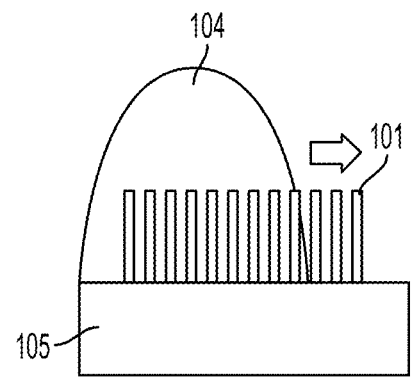
Figure 11C:
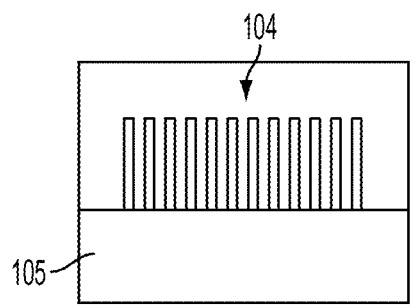
Figure 11D:
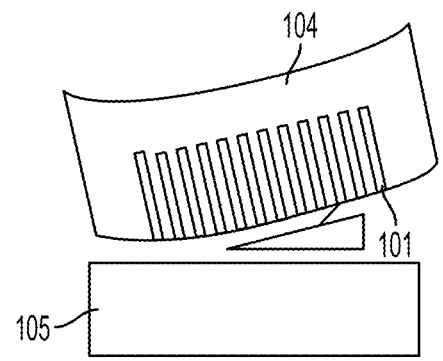
Figure 11E:
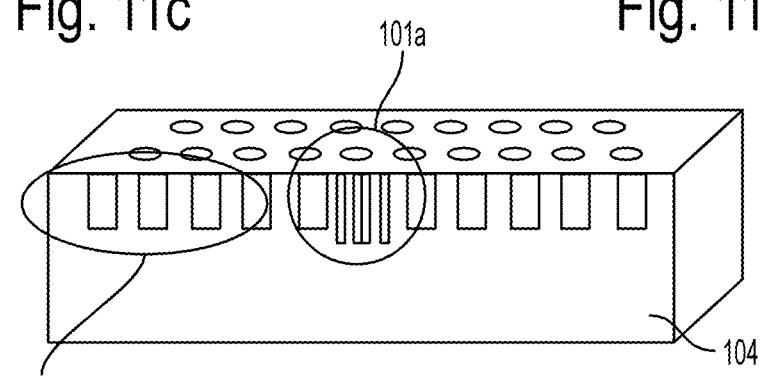

The method may also include forming the PDMS layer 104 around and within the array of nanopillars 106, as discussed above. Thus, an embodiment of the method includes depositing a PDMS layer 104 on the substrate 105, as shown in FIG. 11(b), to at least partially embed the array of nanopillars in PDMS (FIG. 11(c)). Next, the PDMS layer 104 may be mechanically removed from the substrate 105 such that the plurality of nanopillars 101 become detached from the substrate 105 and remain embedded in the PDMS layer 104 after removal from the substrate 105, as shown in FIG. 11(d). FIG. 11(e) shows that the plurality of nanopillars 101 maintains the array pattern 106 in the PDMS layer 104 after removal from the substrate 105.

Nanopillar photonic crystal lasers 100 according to some embodiments of the current invention have been demonstrated by optical pumping.

The following provides some examples according to some embodiments of the current invention. The general concepts of the current invention are not limited to these particular examples that are provided to explain concepts of the current invention.

EXAMPLES

As discussed above, directed growth of III-V nanopillars can be used to demonstrate bottom-up photonic crystal lasers according to an embodiment. Simultaneous formation of both the photonic band-gap and active gain region is achieved via catalyst-free selective-area metal-organic chemical vapor deposition on masked GaAs substrates. The nanopillars implement a GaAs/InGaAs/GaAs axial double heterostructure for accurate, arbitrary placement of gain within the cavity and lateral In GaP shells or passivation layers to reduce surface recombination. The lasers operate at single-mode at room temperature with a low threshold peak power density of about 625 W/cm². Cavity resonance and lasing wavelength is lithographically-defined by controlling pillar pitch and diameter to vary, for example, from about 960 to 989 nm.

As shown in FIG. 14, the selective-area grown nanopillars in these examples take the equilibrium shape determined by environmental growth conditions with the resulting side-wall facets consisting of the {1-10} family of crystal planes 111. The resulting pillar side-walls are perfectly vertical and have atomic scale roughness, which inherently avoids two major contributions to loss in top-down photonic crystal cavities. Both pillar placement and diameter, which fix cavity resonance wavelength and Q, are determined lithographically. Thus, the cavity resonant wavelength can be designed arbitrarily. Furthermore, the same patterns used to define the position and diameter of the nanopillars also include optical alignment marks for device integration.

The bottom-up photonic crystal lasers consist of nanopillars that may be embedded in polydimethylsiloxane (PDMS) as shown in FIG. 1. In an embodiment, the nanopillars are first grown on a $SiN_X$ masked GaAs (111)B substrate. Following growth, PDMS is drop cast to a thickness of approximately 1 mm and cured in atmosphere. The PDMS film is then removed mechanically from the growth substrate. During the PDMS lift-off from the substrate, the nanopillars are detached at the base making the patterned substrate reusable for additional growths. The resulting structure forms a complete laser cavity, where the nanopillars are surrounded by PDMS on all but the top side where they are exposed to air. The PDMS casting and lift off procedure is shown in FIG. 11.

FIG. 2 shows an SEM image of a typical nanopillar photonic crystal laser as grown on the substrate. In the embodiment of FIG. 2, each device is a 5 μm×5 μm array of hexagonally-packed pillars which comprise the resonant cavity, surrounding seven central pillars which form the laser active region. The cavity Q and resonant wavelength are lithographically-defined by nanopillar diameter and pitch, respectively. A 4×6 matrix of cavity arrays is patterned across the growth substrate for controlled variation in both pillar diameter (100-130 nm) and inter-pillar pitch (324-342 nm).

Figure 3:
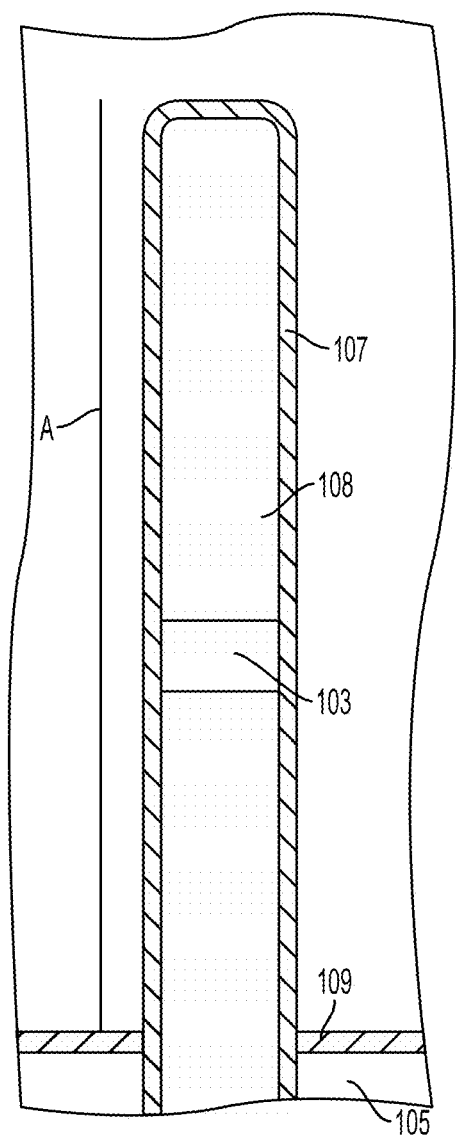
FIG. 3 shows a cross-section STEM micrograph of a nanopillar showing the InGaAs insert located at the center of the pillar and InGaP shell according to an embodiment of the current invention.

A cross-section scanning transmission electron microscope (STEM) image of a single representative nanopillar from one of the cavities as shown in FIG. 3. In this example, the pillars are approximately 730 nm tall and 120 nm in diameter with about 2-3% variation from center to edge and comprised of both an axial and a radial heterostructure. The axial double-heterostructure is formed by a well-placed 130 nm $In_xGa_{1-x}As$ insert, where x is measured to be approximately 15% from both the spontaneous emission peak wavelength and energy dispersive x-ray spectroscopy scan. The lateral heterostructure is formed by a 5 nm lattice-matched InGaP shell to reduce surface recombination.

Figure 15:
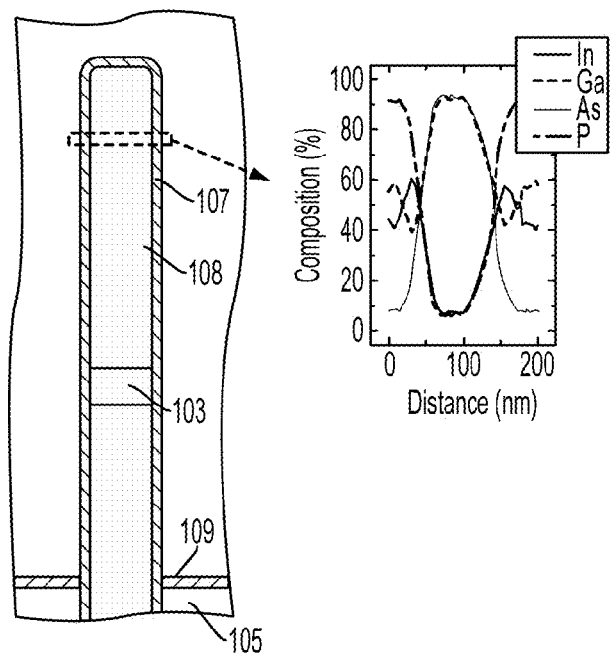
FIG. 15 shows an example of a nanopillar with a graph illustrating the material composition across a cross-section of the nanopillar according to an embodiment of the current invention.
Figure 16:
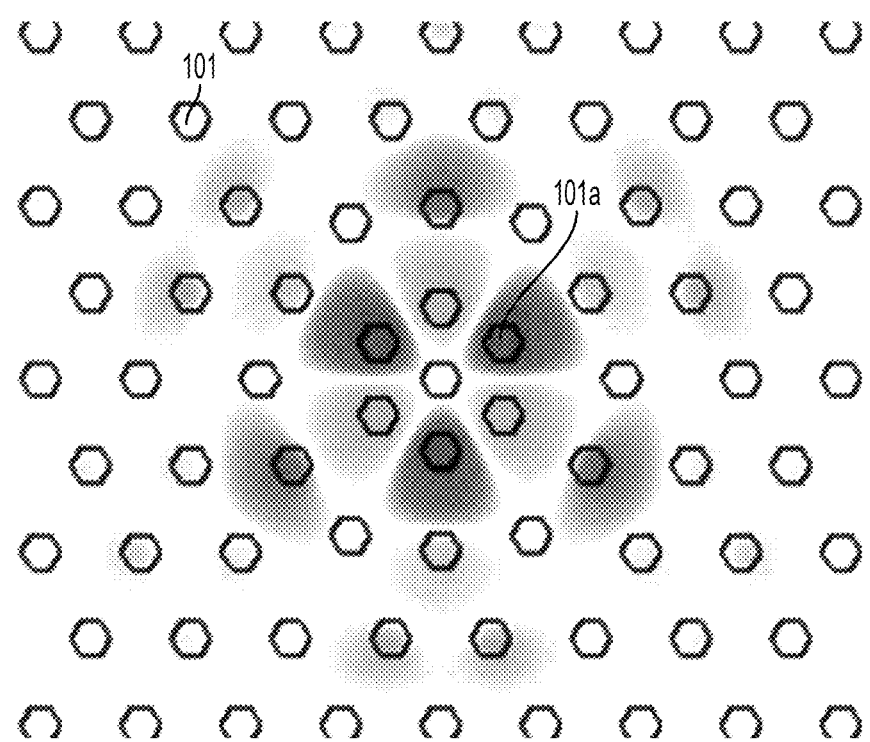
FIG. 16 shows an example of an electric-field within the array of nanopillars according to an embodiment of the current invention.

FIG. 15 shows a similar cross-section STEM image of a single nanopillar. In addition, FIG. 15 includes a graph illustrating the varying composition across a section of the nanopillar.

Figure 5:
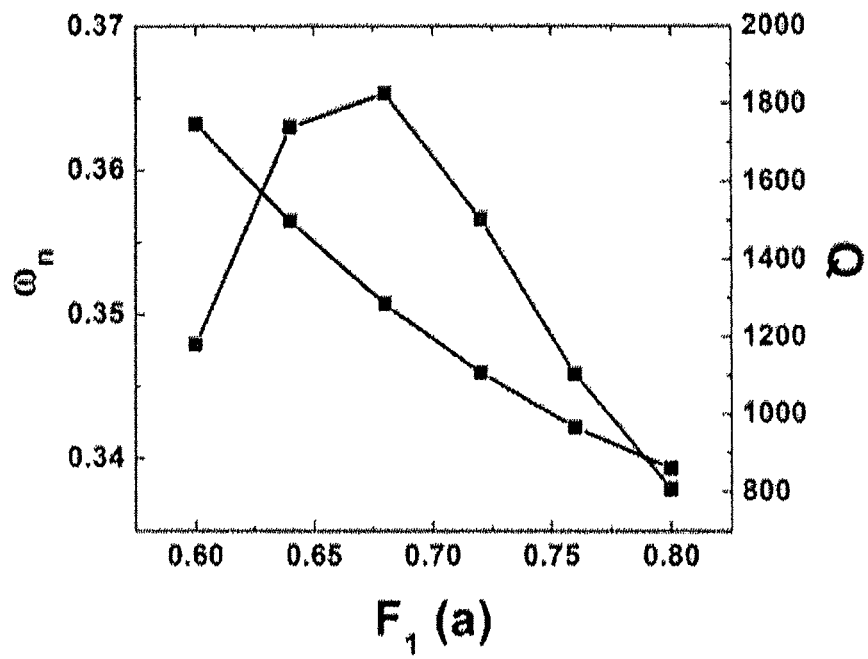
FIG. 5 shows the Q and frequency dependence on the nanopillar spacing in region (i) for the example of FIG. 4.
Figure 6:
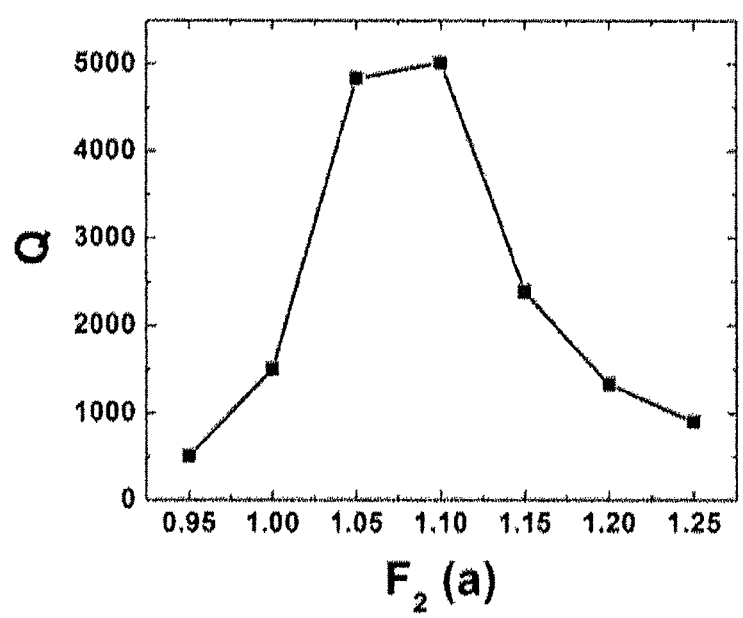
FIG. 6 shows the Q dependence on the nanopillar spacing in region (ii) for the example of FIG. 4.

3-D finite-difference time-domain (FDTD) simulations are employed to optimize structural parameters such as the height, radius, and the locations of the nanopillars. The cavity is formed by modifying the original lattice points of the photonic-crystal as shown in FIG. 4. The cavity consists of two separate sub-regions defined by the two hexagonal contours labeled (i) and (ii). For the inner region (i), the six pillars are rotated by 90° with respect to the center pillar position. The distance is then scaled down from the center by a factor of $F_1$. FIG. 5 shows the change in cavity Q and normalized resonant frequency $\omega_n$ as a function of $F_1$. It should be noted that Q and the frequency of the mode are dependent on $F_1$, since the majority of the mode energy is concentrated within these six pillars. For the outer region (ii), the twelve pillar positions are arranged in a circle and fine-tuned by the scaling factor $F_2$ to optimize Q as shown in FIG. 6.

Figure 7:
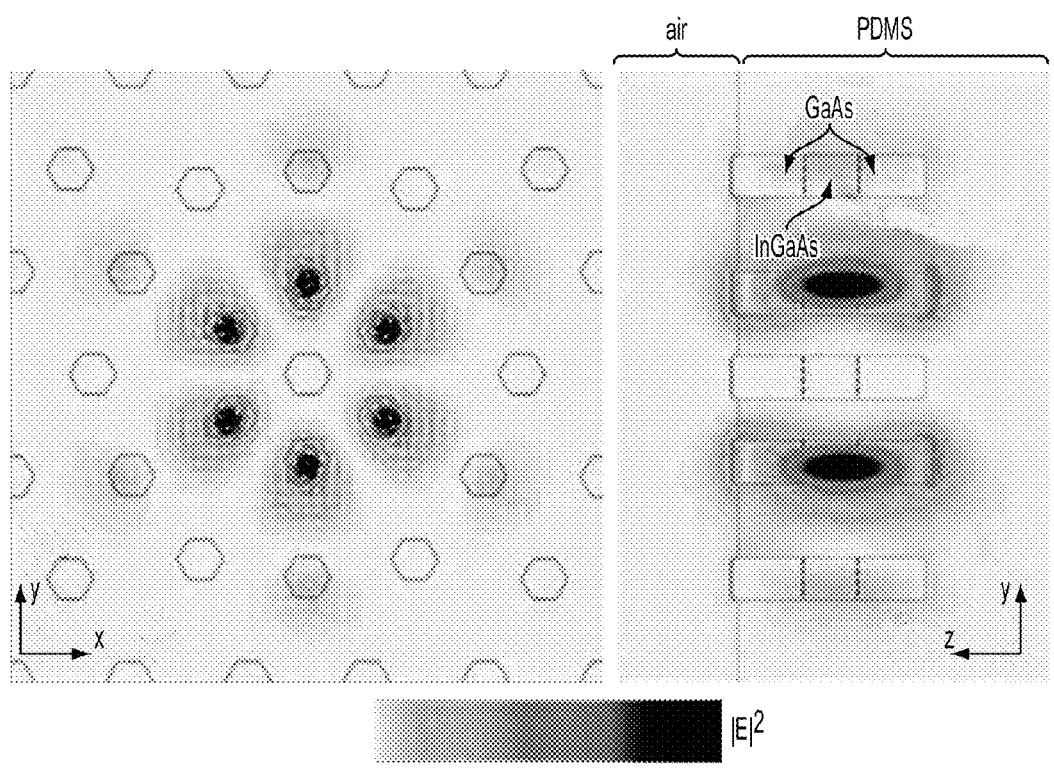
FIG. 7 shows a top-down view of the vector field pattern of the magnetic-field ($H_x$, $H_y$) overlaid upon the electric-field intensity ($|E|^2$) distribution within the cavity showing the hexapole mode overlapping six center nanopillars and cross-section view of $|E|^2$ within the cavity showing the overlap with the InGaAs inserts according to an embodiment of the current invention.

A top-down and cross-sectional view of the electric-field intensity distribution ($|E|^2$) in the cavity is shown in FIG. 7. The final arrangement of the nanopillars in the center of the cavity forms a non-degenerate hexapole mode. The positions of the neighboring pillars are modified to maximize the cavity Q while keeping the resonant frequency close to the center of the photonic band gap in order to maintain a large spontaneous emission factor β. The final result of this design optimization yields a simulated cavity Q of 4,600 with an effective mode volume $V_{eff}$ of 0.137 $(\lambda/n)^3$.

In the cross-sectional view of FIG. 7, the location of the InGaAs inserts is highlighted to show the confinement of carriers to the field anti-node. Based on the insert length as a fraction of the total pillar, the energy confinement factor Γ and threshold gain $g_{th}$ are calculated with group index and material dispersion of bulk InGaAs. With an insert length that is 18% of the total height as measured by STEM, this method yields Γ=0.185 and $g_{th}$=197 cm$^{-1}$.

Figure 9:
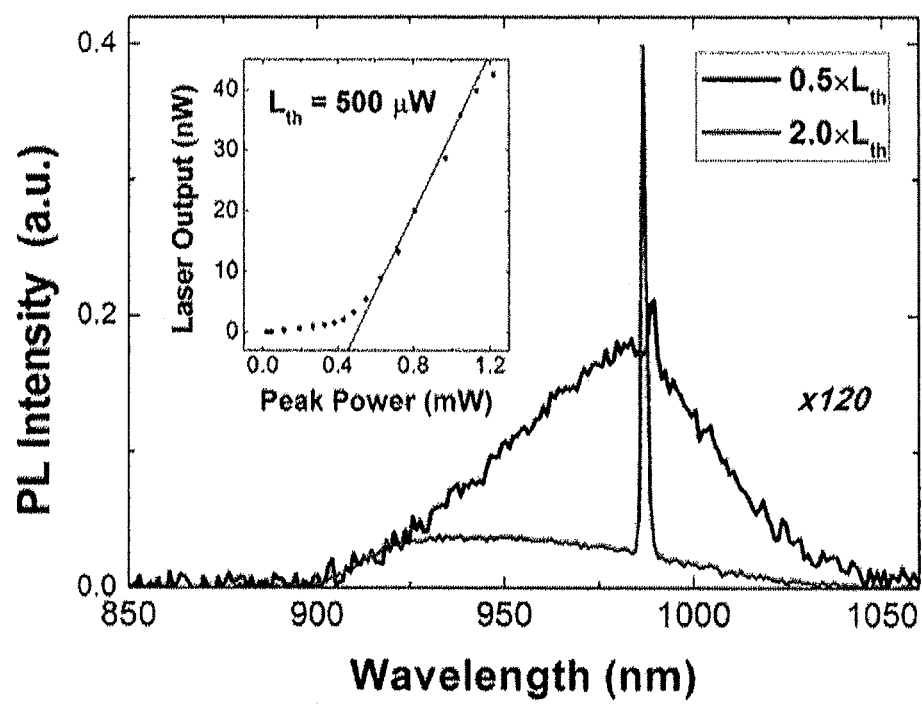
FIG. 9 shows emission spectra of a nanopillar photonic crystal laser according to an embodiment of the current invention emitting at 989 nm both at $0.5 \times L_{th}$ and $2 \times L_{th}$. Inset shows L-L curve of the same device with a threshold of 500 μW peak pulse power.

The devices in these examples are optically pumped using a pulsed semiconductor laser with a 660 nm peak wavelength, 10 μm diameter spot size, and 16 ns excitation pulse at a 1 MHz repetition rate. The invention, however, is not limited to optical pumping and can employ electrical pumping. A 50× microscope objective oriented at 45° to the surface normal is used to both excite the nanopillars and collect emission. Simulated far-field radiation patterns of the cavity resonant mode show that the laser emission to be directed 50°-70° from normal. See FIG. 8. FIG. 9 shows emission spectra from one array both below and above threshold at pump powers of $0.5 \times L_{th}$ and $2 \times L_{th}$. Below threshold, the spectrum is the integrated emission from all nanopillars within the array including cavity and active region. The spontaneous spectrum is peaked near 975 nm with FWHM of 65 nm. Even at this very low pump power, the resonant cavity mode can be detected. The FWHM of the modal peak is approximated to be 0.45 nm, which corresponds to an experimental cavity Q of approximately 2000. At $2 \times L_{th}$, the spectrum is dominated by a single peak at 989 nm. The corresponding L-L curve for this device, shown as the inset, indicates a lasing threshold of 500 μW peak pulse power or 625 W/cm² peak power density. The output power increases linearly until above $2 \times L_{th}$ where the device emission begins to saturate, reaching an estimated peak output power of 42.5 nW at the InGaAs detector.

The model used to predict the ideal Q required threshold gain gives $g_{th}=197$ cm$^{-1}$. However, with the measured cavity Q of ~2000, an actual threshold gain of $g_{th}$~500 cm$^{-1}$ is predicted. Since InGaAs bulk gain can be expected to reach greater than 1000 cm$^{-1}$ at room temperature with moderate carrier densities, the measured L-L curve and consequent lasing threshold appear to be in reasonable agreement with the predictions of the model. This combined with the measured data provide strong evidence that the devices achieve single mode lasing at low threshold power density. Additionally, the fact that these estimates are based on gain in bulk InGaAs indicates the effectiveness of the InGaP shells used for surface passivation since the threshold for unpassivated InGaAs with the given surface to volume ratio would not be achievable at room temperature.

Figure 10:
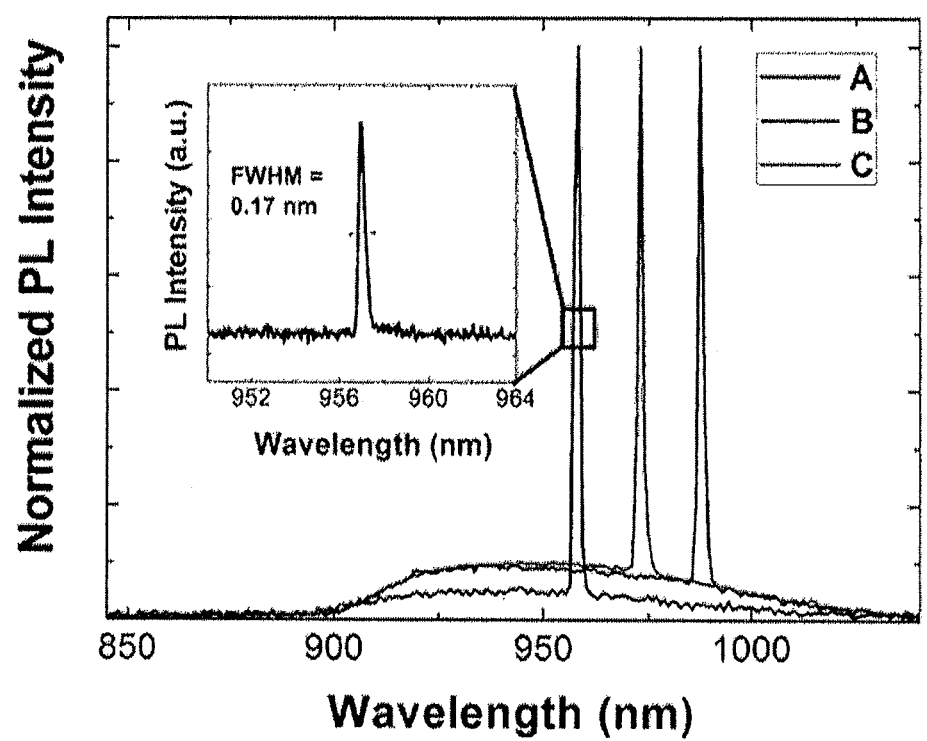
FIG. 10 shows a comparison of devices according to some embodiments of the current invention A, B, and C corresponding to the peaks in that order from left to right with different pitch and diameter nanopillars that emit at wavelengths between 960 and 990 nm. Inset shows high-resolution laser spectrum of device A with a FWHM of 0.17 nm.

FIG. 10 shows a comparison of three devices at about 2×$L_{th}$ which demonstrates the ability to control lasing wavelength lithographically. The devices A, B, and C are designed to have the cavity resonance at 950, 970, and 990 nm, which correspond to pillar pitch a of 324 nm, 331 nm, and 338 nm, respectively. This allows control of the wavelength with pitch by $d\lambda/da=2.1$. However, the final height of the grown pillars may not match the target height from the optimized design due to both inaccuracy of the growth time of the pillars, as well as the difference in growth rate between devices due to difference in diameter. The resulting peak wavelengths are 960 nm, 974 nm, and 989 nm. A high resolution scan of the laser spectrum of device A, in the inset, shows a FWHM of 0.17 nm.

The bottom-up approach to nanopillar-photonic crystal lasers introduces many design possibilities, which cannot be realized with the top-down photonic crystal devices. Based on the measured threshold power density, changes for optimization of the nanopillar photonic crystal cavities and increased InGaAs insert thickness could reduce the threshold gain by a factor of 4 or 5 to achieve continuous wave, room temperature operation. Additional modification of nanopillar position and diameter within the cavity will enable engineering of the far-field emission pattern. The current design featuring nanopillars embedded in PDMS can be useful as internal light sources for spectroscopy in microfluidic and biosensing systems, especially since the patterned growth substrate can be reused after PDMS lift-off. In parallel, on-chip integration utilizing a dielectric core-cladding stack to achieve out-of-plane optical confinement while the nanopillars remain on the growth substrate may be possible. Finally, with the narrow linewidth and lithographic control of wavelength, these devices are promising for on-chip wavelength division multiplexing applications.

REFERENCES

1. T. Kuykendall, P. Ulrich, S. Aloni, P. Yang. Nature Mater. 2007, 6, 951
2. R. E. Algra et al. Nature 2008, 456, 369
3. L. J. Lauhon, M. S. Gudiksen, D. Wang, C. M. Lieber. Nature 2002, 420, 57
4. T. Martensson et al. Nano Lett. 2004, 4, 1987
5. K. Tomioka, J. Motohisa, S. Hara, T. Fukui. Nano Lett. 2008, 8, 3475
6. R. Yan, D. Gargas, P. Yang. Nature Photon. 2009, 3, 569
7. J. Heo, W. Guo, P. Bhattacharya. Appl. Phys. Lett. 2011, 98, 21110
8. H-G Park, F. Qian, C. J. Barrelet, Y. Li. Appl. Phys. Lett. 2007, 91, 251115
9. R. F. Oulton, V. J. Sorger, T. Zentgraf, R-M Ma, C. Gladden, L. Dai, G. Bartal, X. Zhang. Nature 2009, 461, 629
10. D. J. Gargas, M. C. Moore, A. Ni, S-W Chang, Z. Zhang, S-L Chuang, P. Yang. ACS Nano 2010, 4, 3270
11. R. Chen, T-T D. Tran, K. W. Ng, W. S. Ko, L. C. Chuang, F. G. Sedgwick, C. Chang-Hasnain. Nature Photon. 2011, 5, 170
12. C. Z. Ning. Phys. Status Solidi B 2010, 247, 774
13. D. B. Li, C. Z. Ning. Phys. Rev. B 2009, 80, 153304
14. L. A. Coldren, S. W. Corzine. Diode Lasers and Photonic Integrated Circuits. Wiley 1995
15. 0. Painter, R. K. Lee, A. Scherer, A. Yariv, J. D. O'Brien, P. D. Dapkus, I. Kim. Science 1999, 284, 1819
16. K. Nozaki, S. Kita, T. Baba. Opt. Express 2007, 15, 7506
17. M. Nomura, N. Kumagai, S. Iwamoto, Y. Ota, Y. Arakawa. Opt. Express 2009, 17, 15975
18. A. C. Scofield, J. N. Shapiro, A. Lin, A. D. Williams, P-S Wong, B. L. Liang, D. L. Huffaker. Nano Lett. 2011, 11, 2242
19. J. N. Shapiro, A. Lin, P. S. Wong, A. C. Scofield, C. Tu, P. N. Senanayake, G. Mariani, B. L. Liang, D. L. Huffaker. Appl. Phys. Lett. 2010, 97, 243102
20. K. Ikejiri, T. Sato, H. Yoshida, K. Hiruma, J. Motohisa, S. Hara, T. Fukui. Nanotechnology 2008, 19, 265604
21. K. Tomioka, J. Motohisa, S. Hara, T. Fukui. Jap. Journal of Appl. Phys. 2007, 46, 1102
22. J. Noborisaka, J. Motohisa, T. Fukui. Appl. Phys. Lett. 2005, 86, 213102
23. S. G. Johnson, S. Fan, P. R. Villeneuve, J. D. Joannopoulos, L. A. Kolodziejski. Phys. Rev. B 1999, 60, 5751
24. Y. Tanaka, T. Asano, Y. Akahane, B-S Song, S. Noda. Appl. Phys. Lett. 2003, 82, 1661
25. H-Y Ryu, M. Notomi, Y-H Lee. Appl. Phys. Lett. 2003, 83, 4294
26. S-W Chang, T-R Lin, S. L. Chuang. Opt. Express 2010, 18, 15039
27. M. Loncar, A. Scherer, Y. Qiu. Appl. Phys. Lett. 2003, 82, 4628
28. S-H Kim, J-H Choi, S-K Lee, S-H Kim, S-M Yang, Y-H Lee, C. Seassal, P. Regrency, P. Viktorovitch. Opt. Express. 2008, 16, 6515
29. S-H Kim, S-K Kim, Y-H Lee. Phys. Rev. B 2006, 73, 235117
30. N-V-Q Tran, S. Combrie, A. D. Rossi. Phys. Rev. B 2009, 79, 041101

We claim:

1. A nanopillar photonic crystal laser, comprising:
   a plurality of nanopillars each having an axial dimension and two unequal mutually orthogonal cross dimensions; and
   a support structure in contact with at least a portion of each of said plurality of nanopillars,
   wherein said axial dimension of each of said plurality of nanopillars is greater than said two mutually orthogonal cross dimensions,
   wherein said mutually orthogonal cross dimensions are less than 1 μm and greater than 1 nm,
   wherein said support structure holds said plurality of nanopillars in preselected relative orientations and displacements relative to each other to form an array pattern that confines light of a preselected wavelength to a resonance region that intercepts at least one nanopillar of said plurality of nanopillars,
   wherein said support structure is a PDMS layer formed to at least partially embed said plurality of nanopillars; and wherein said at least one nanopillar comprises a lasing material to provide an output laser beam of light at said preselected wavelength.

2. The nanopillar photonic crystal laser according to claim 1, wherein said support structure comprises a substrate that is at least one of attached to or integral with each of said plurality of nanopillars.

3. The nanopillar photonic crystal laser according to claim 1, wherein said at least one of said plurality of nanopillars comprises a passivation layer on a circumferential surface thereof.

4. The nanopillar photonic crystal laser according to claim 3, wherein said passivation layer comprises a material having a band gap that is larger than a band gap of said lasing material.

5. The nanopillar photonic crystal laser according to claim 1, wherein said array pattern comprises a sub-array of nanopillars surrounding said at least one nanopillar and having preselected relative orientations and displacements relative to each other that differ from preselected relative orientations and displacements to said at least one nanopillar.

6. The nanopillar photonic crystal laser according to claim 1, wherein said mutually orthogonal cross dimensions of each of said plurality of nanopillars are less than about 1 μm and greater than about 10 nm.

7. The nanopillar photonic crystal laser according to claim 1, wherein said support structure holds said plurality of nanopillars in orientations that are substantially parallel to each other.

8. The nanopillar photonic crystal laser according to claim 1, wherein said plurality of nanopillars is at least 50 nanopillars.

9. The nanopillar photonic crystal laser according to claim 1, wherein said preselected relative displacements of said plurality of nanopillars are accurate to within 10%.

10. A method of making a nanopillar photonic crystal laser, comprising:
providing a mask layer on a substrate;
patterning said mask layer to form a plurality of holes in said mask layer; and
growing a plurality of nanopillars on said substrate through said plurality of holes such that said plurality of nanopillars are arranged in an array pattern with preselected relative orientations and displacements relative to each other;
forming a PDMS layer on said substrate to at least partially embed said array of nanopillars in said PDMS layer; and
mechanically removing said PDMS layer from said substrate such that said plurality of nanopillars become detached from said substrate and remain embedded in said PDMS layer after removal from said substrate;
wherein said plurality of nanopillars maintain said array pattern in said PDMS layer after removal from said substrate;
wherein said plurality of nanopillars in said array pattern confines light of a preselected wavelength to a resonance region that intercepts at least one nanopillar of said plurality of nanopillars, and wherein said least one nanopillar comprises a lasing material to provide an output laser beam of light at said preselected wavelength.

11. The method of making a nanopillar photonic crystal laser according to claim 10, further comprising, prior to growing said plurality of nanopillars, etching said substrate where exposed by said plurality of holes.

12. The method of making a nanopillar photonic crystal laser according to claim 10, wherein said step of growing said plurality of nanopillars includes forming a passivation layer on a circumferential surface of each of said plurality of nanopillars.

13. A nanopillar photonic crystal laser, comprising:
a plurality of nanopillars each having an axial dimension and two unequal mutually orthogonal cross dimensions; and
a support structure in contact with at least a portion of each of said plurality of nanopillars,
wherein said axial dimension of each of said plurality of nanopillars is greater than said two mutually orthogonal cross dimensions,
wherein said mutually orthogonal cross dimensions are less than 1 μm and greater than 1 nm,
wherein said support structure holds said plurality of nanopillars in preselected relative orientations and displacements relative to each other to form an array pattern that confines light of a preselected wavelength to a resonance region that intercepts at least one nanopillar of said plurality of nanopillars,
wherein said array pattern comprises a sub-array of nanopillars surrounding said at least one nanopillar and having preselected relative orientations and displacements relative to each other that differ from preselected relative orientations and displacements to said at least one nanopillar, and
wherein said at least one nanopillar comprises a lasing material to provide an output laser beam of light at said preselected wavelength.

14. The nanopillar photonic crystal laser according to claim 13, wherein said at least one of said plurality of nanopillars comprises a passivation layer on a circumferential surface thereof.

15. The nanopillar photonic crystal laser according to claim 14, wherein said passivation layer comprises a material having a band gap that is larger than a band gap of said lasing material.

16. The nanopillar photonic crystal laser according to claim 13, wherein said mutually orthogonal cross dimensions of each of said plurality of nanopillars are less than about 1 μm and greater than about 10 nm.

17. The nanopillar photonic crystal laser according to claim 13, wherein said support structure holds said plurality of nanopillars in orientations that are substantially parallel to each other.

18. The nanopillar photonic crystal laser according to claim 13, wherein said preselected relative displacements of said plurality of nanopillars are accurate to within 10%.

* * * * *